United States Patent
Liao et al.

(10) Patent No.: US 9,589,885 B2
(45) Date of Patent: *Mar. 7, 2017

(54) DEVICE HAVING MULTIPLE-LAYER PINS IN MEMORY MUX1 LAYOUT

(71) Applicant: TAIWAN SEMICONDUCTOR MANUFACTURING COMPANY, LTD., Hsinchu (TW)

(72) Inventors: Hung-Jen Liao, Hsinchu (TW);
Jung-Hsuan Chen, Hsinchu (TW);
Chien Chi Tien, Hsinchu (TW);
Ching-Wei Wu, Caotun Town (TW);
Jui-Che Tsai, Tainan (TW);
Hong-Chen Cheng, Hsinchu (TW);
Chung-Hsing Wang, Baoshan Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/835,788

(22) Filed: Aug. 26, 2015

(65) Prior Publication Data

US 2015/0364412 A1    Dec. 17, 2015

Related U.S. Application Data

(63) Continuation of application No. 14/102,623, filed on Dec. 11, 2013, now Pat. No. 9,129,956.

(51) Int. Cl.
*H01L 23/00* (2006.01)
*H01L 23/50* (2006.01)
(Continued)

(52) U.S. Cl.
CPC ........ *H01L 23/50* (2013.01); *H01L 23/49811* (2013.01); *H01L 23/49827* (2013.01);
(Continued)

(58) Field of Classification Search
CPC ............. H01L 23/53204; H01L 23/528; H01L 27/0203

See application file for complete search history.

(56) References Cited

U.S. PATENT DOCUMENTS

| | | | |
|---|---|---|---|
| 7,935,965 | B1 | 5/2011 | Brozek |
| 2003/0107908 | A1 | 6/2003 | Jang et al. |

(Continued)

FOREIGN PATENT DOCUMENTS

| | | |
|---|---|---|
| KR | 20030046715 | 6/2003 |
| KR | 20130111264 | 10/2013 |

OTHER PUBLICATIONS

Office Action dated Oct. 24, 2016 from corresponding application No. KR 10-2014-0177305.

*Primary Examiner* — Ngan Ngo

(74) *Attorney, Agent, or Firm* — Hauptman Ham, LLP

(57) ABSTRACT

An integrated circuit (IC) memory device includes a first conductive layer. The IC memory device also includes a second conductive layer over the first conductive layer. The IC memory device further includes a first-type pin box electrically coupled with the first conductive layer. The IC memory device additionally includes a second-type pin box, different from the first-type pin box, electrically coupled with the second conductive layer.

20 Claims, 3 Drawing Sheets

(51) Int. Cl.
*H01L 27/11* (2006.01)
*H01L 23/532* (2006.01)
*H01L 27/02* (2006.01)
*H01L 23/528* (2006.01)
*H01L 23/498* (2006.01)
*H01L 23/522* (2006.01)

(52) U.S. Cl.
CPC ........ *H01L 23/528* (2013.01); *H01L 23/5226* (2013.01); *H01L 23/53204* (2013.01); *H01L 27/0203* (2013.01); *H01L 27/11* (2013.01); *H01L 2924/0002* (2013.01)

(56) References Cited

U.S. PATENT DOCUMENTS

| | | | | |
|---|---|---|---|---|
| 2004/0256731 | A1* | 12/2004 | Mao | C08L 65/00 257/773 |
| 2004/0262635 | A1* | 12/2004 | Lee | B82Y 10/00 257/199 |
| 2005/0186801 | A1* | 8/2005 | Uno | H01L 21/3065 438/706 |
| 2006/0012966 | A1* | 1/2006 | Chakravorty | H01L 23/50 361/763 |
| 2006/0180939 | A1* | 8/2006 | Matsuno | H01L 23/576 257/773 |
| 2007/0262401 | A1* | 11/2007 | Yokoyama | G01L 9/0073 257/415 |
| 2008/0197502 | A1* | 8/2008 | Kikuchi | H01L 21/2885 257/758 |
| 2008/0230916 | A1* | 9/2008 | Saito | H01L 21/76838 257/773 |
| 2008/0299739 | A1* | 12/2008 | Yoshizawa | H01L 21/02164 438/424 |
| 2009/0020785 | A1* | 1/2009 | Takase | H01L 27/24 257/211 |
| 2010/0178619 | A1 | 7/2010 | Huang et al. | |
| 2011/0272664 | A1* | 11/2011 | Tada | H01L 27/228 257/4 |
| 2011/0298021 | A1* | 12/2011 | Tada | H01L 21/02126 257/288 |
| 2012/0091520 | A1* | 4/2012 | Nakamura | H01L 21/76898 257/303 |
| 2012/0193601 | A1* | 8/2012 | Tsukamoto | G11C 11/16 257/5 |
| 2012/0248580 | A1* | 10/2012 | Matsugai | H01L 22/12 257/621 |
| 2013/0200363 | A1* | 8/2013 | Sunamura | H01L 27/105 257/43 |
| 2013/0200472 | A1* | 8/2013 | Sunamura | H01L 29/78 257/411 |
| 2013/0256906 | A1* | 10/2013 | Mori | H01L 23/5384 257/774 |
| 2013/0258759 | A1 | 10/2013 | Liaw | |
| 2014/0094030 | A1* | 4/2014 | Shimotsusa | H01L 21/768 438/652 |
| 2014/0217518 | A1* | 8/2014 | Shih | H01L 27/11573 257/401 |
| 2014/0239440 | A1* | 8/2014 | Reber | H01L 23/5258 257/529 |
| 2015/0085579 | A1* | 3/2015 | Chen | H01L 27/1157 365/185.17 |
| 2015/0270307 | A1* | 9/2015 | Umebayashi | H01L 27/14623 257/292 |
| 2016/0035722 | A1* | 2/2016 | Or-Bach | H01L 27/0883 257/504 |

\* cited by examiner

DEVICE HAVING MULTIPLE-LAYER PINS IN MEMORY MUX1 LAYOUT

PRIORITY CLAIM

The present application is a continuation of U.S. application Ser. No. 14/102,623, filed Dec. 11, 2013, which is incorporated herein by reference in its entirety.

BACKGROUND

Integrated circuit (IC) process and package limitations associated with decreasing minimum feature size are making it increasingly difficult to retain prior pin pad (pin box) spacing (pitch). For example, single exposure and single etch (1P1E) photolithography techniques limit pin box pitch to 800 nm for 5 specified pins, but 5 input/output (I/O) pins electrically coupled to a static random access memory (SRAM) multiplexer one (MUX1) memory cell in some newer standard cell libraries only allows for 450 nm to 720 nm total space for pin boxes, which is not sufficient for 5 I/O pins.

While 1P1E photolithography techniques limit pin box pitch to 800 nm for 5 pins, double exposure and double etch (2P2E) photolithography techniques limit pin box pitch to 635 nm for 5 pins. Although 2P2E pitch at 635 nm is preferable to 1P1E pitch at 800 nm in terms of space required, 2P2E pin boxes have additional electrical limitations in addition to requiring too great a pitch for many standard cell applications.

BRIEF DESCRIPTION OF THE DRAWINGS

Reference is now made to the following descriptions taken in conjunction with the accompanying drawings, in which.

DETAILED DESCRIPTION

Figure 1:
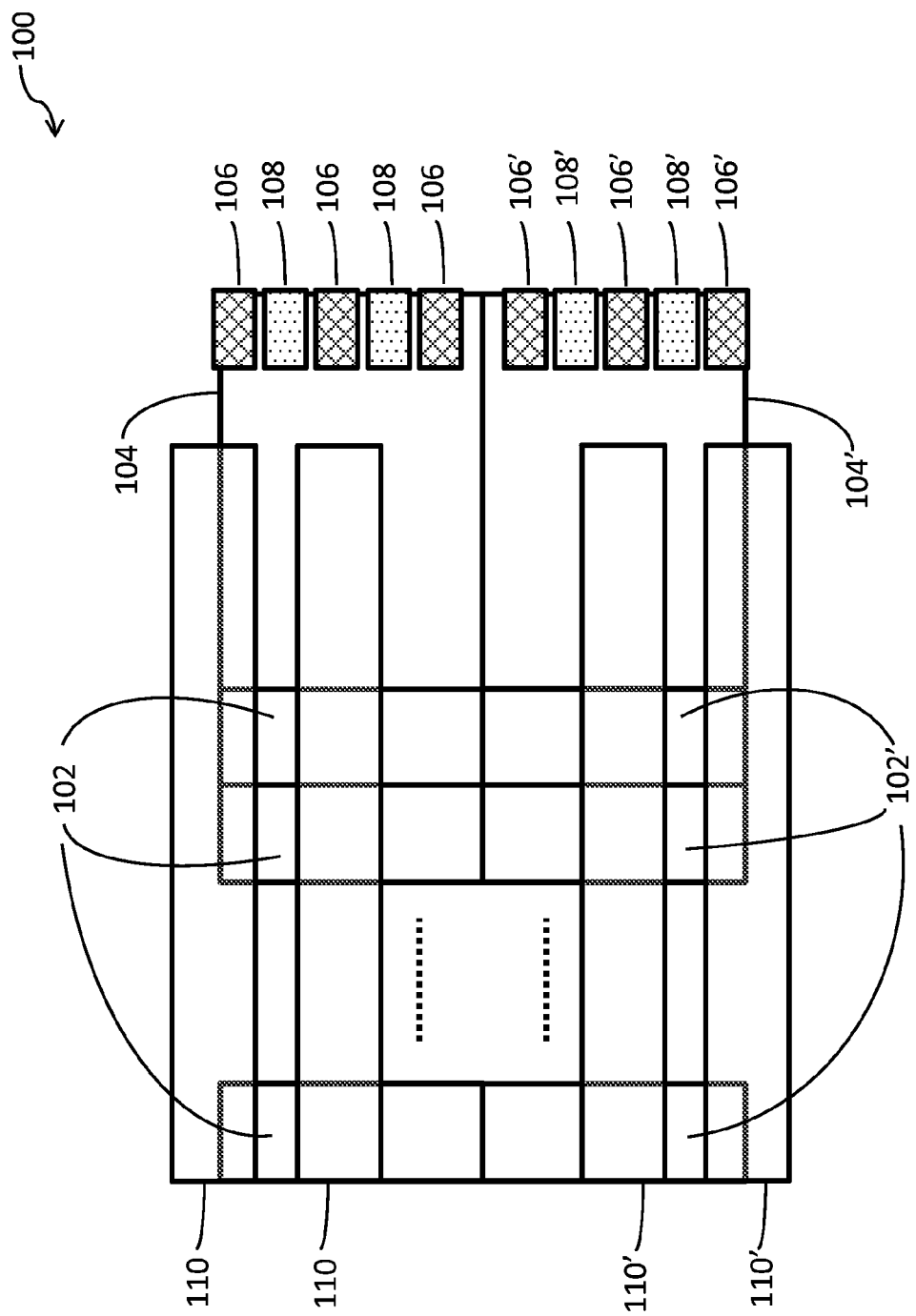
FIG. 1 is a top view of an IC layout of a memory macro sub-block according to an embodiment.

The making and using of various embodiments are discussed in detail below. It should be appreciated; however, that the present disclosure provides many applicable inventive concepts that can be embodied in a wide variety of specific contexts. The specific embodiments discussed are examples of specific ways to make and use, and do not limit the scope of the disclosure.

In addition, the present disclosure may repeat reference numerals and/or letters in the various examples or designate corresponding components with same last two digits, but with a different preceding digit or digits. This repetition is for the purpose of simplicity and clarity of identification of corresponding objects and does not necessarily in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," and similar terms as well as derivatives thereof (e.g., "horizontally," "downwardly," "upwardly," and similar.) are used for ease of the present disclosure of one feature in relation to another feature. The spatially relative terms are intended to cover different orientations of the device including the features.

FIG. 1 is a top view of an IC layout of a memory macro sub-block 100. The memory macro sub-block 100 includes a first series of SRAM MUX1 memory cells 102 electrically coupled to an I/O block 104 and a Nth series of SRAM MUX1 memory cells 102' electrically coupled to an Nth I/O block 104'. Note that "Nth" indicates a specified whole ordinal number of memory cells 102', such as without limitation, $2^{nd}$, $3^{rd}$, $4^{th}$, $5^{th}$, $6^{th}$, $7^{th}$ and $8^{th}$, and so on, electrically coupled to I/O block 104'. In some embodiments, some metal layer patterns are formed by a single photolithography step followed by a single etch step with a single patterned photoresist layer ("1P1E") and other metal layer patterns are formed by two photolithography steps and two etch steps in two sequentially patterned photoresist layers ("2P2E"). While smaller metal layer features are often achieved with 2P2E, the costs of forming metal layers with a 2P2E process exceed the costs associated with forming metal layers with a 1P1E process because of the additional steps. I/O block 104 is electrically coupled to three 2P2E-compliant I/O pin boxes 106 and two 1P1E-compliant I/O pin boxes 108. In some embodiments, wires are bonded to pin boxes 106, 108 to provide electrical connections to a semiconductor device package capable of providing external electrical connections. Similarly, I/O block 104' is electrically coupled to three 2P2E-compliant I/O pin boxes 106' and two 1P1E-compliant I/O pin boxes 108'. The first series of SRAM MUX1 memory cells 102 and I/O block 104 are electrically coupled to power pins 110. The Nth series of SRAM MUX1 memory cells 102' and I/O block 104' are electrically coupled to power pins 110'. One of the power pins 110 is electrically coupled to a power supply voltage (VDD) and another of the power pins 110 is electrically coupled to a power supply ground voltage (VSS). One of the power pins 110' is electrically coupled to VDD and another of the power pins 110' is electrically coupled to VSS. Note that description herein of a reference numeral designated item is considered to also apply to an item designated by a corresponding reference numeral prime ('), unless expressly stated to the contrary. For example, description of SRAM MUX1 memory cells 102 also applies to SRAM MUX1 memory cells 102'.

The three 2P2E-compliant I/O pin boxes 106 are electrically coupled to metal 1 and metal 2 (M1/M2) routing layers, while the two 1P1E-compliant I/O pin boxes 108 are electrically coupled to metal 3 and metal 4 (M3/M4) routing layers. In some embodiments, the three 2P2E-compliant I/O pin boxes 106 are electrically coupled to metal 3 and metal 4 (M3/M4) routing layers, while the two 1P1E-compliant I/O pin boxes 108 are electrically coupled to metal 1 and metal 2 (M1/M2) routing layers. In some embodiments, the I/O pin boxes 106 and I/O pin boxes 108 are all 1P1E-compliant. In some embodiments, the I/O pin boxes 106 and I/O pin boxes 108 are all 2P2E-compliant. Metal vias are used to electrically couple multiple metal layers. For example, M1 and M2 are electrically coupled by one or more metal vias, and M3 and M4 are electrically coupled by one or more metal vias. In some embodiments, I/O pin boxes 106 and I/O pin boxes 108 are electrically coupled with other metal layers or with more than two metal layers. In some embodiments, a conductive layer is a metal layer. In some embodiments conductive, non-metal layers replace metal layers as described herein. M1/M2 routing layers are lower (further into FIG. 1 on the Z-axis, away from a viewer) than the M3/M4 routing layers which are above (further away from FIG. 1 on the Z-axis, towards the viewer) the M1/M2 routing layers. The three 2P2E I/O pin boxes 106 are physically placed in row at a lower level than the two 1P1E I/O pin boxes 108 which are on an upper level. The three 2P2E I/O pin boxes 106 are formed in either M1 or M2 and the two 1P1E I/O pin boxes 108 are formed in either M3 or M4. In some embodiments the I/O pin boxes 106, 108 are formed in metal at other levels.

The three 2P2E I/O pin boxes 106 and the two 1P1E-compliant I/O pin boxes 108 are configured to be wider than tall, as illustrated in FIG. 1. Physical separation of the three 2P2E I/O pin boxes 106 on a lower level and the two 1P1E I/O pin boxes 108 on an upper level above the lower level enable additional spacing between the pins so that pitch requirements associated with 1P1E and 2P2E photolithography techniques are both complied with. Smaller pitch requirements associated with the 2P2E I/O pin boxes 106 enable at least three 2P2E I/O pins to be placed on a single lower level at a rightmost edge of the I/O block 104, while larger pitch requirements associated with the 1P1E I/O pin boxes 108 enable at least two 1P1E I/O pins to be placed on a single upper level at a rightmost edge of the I/O block 104. In some embodiments, more or less numbers of I/O pins are placed on a level at an edge of the I/O block 104. Placement of the three 2P2E I/O pin boxes 106 and two 1P1E I/O pins at an edge of the I/O block 104 enable five I/O pins to be electrically coupled to the I/O block 104 in compliance with associated pitch requirements and design requirements specifying 5 pins.

Figure 2:
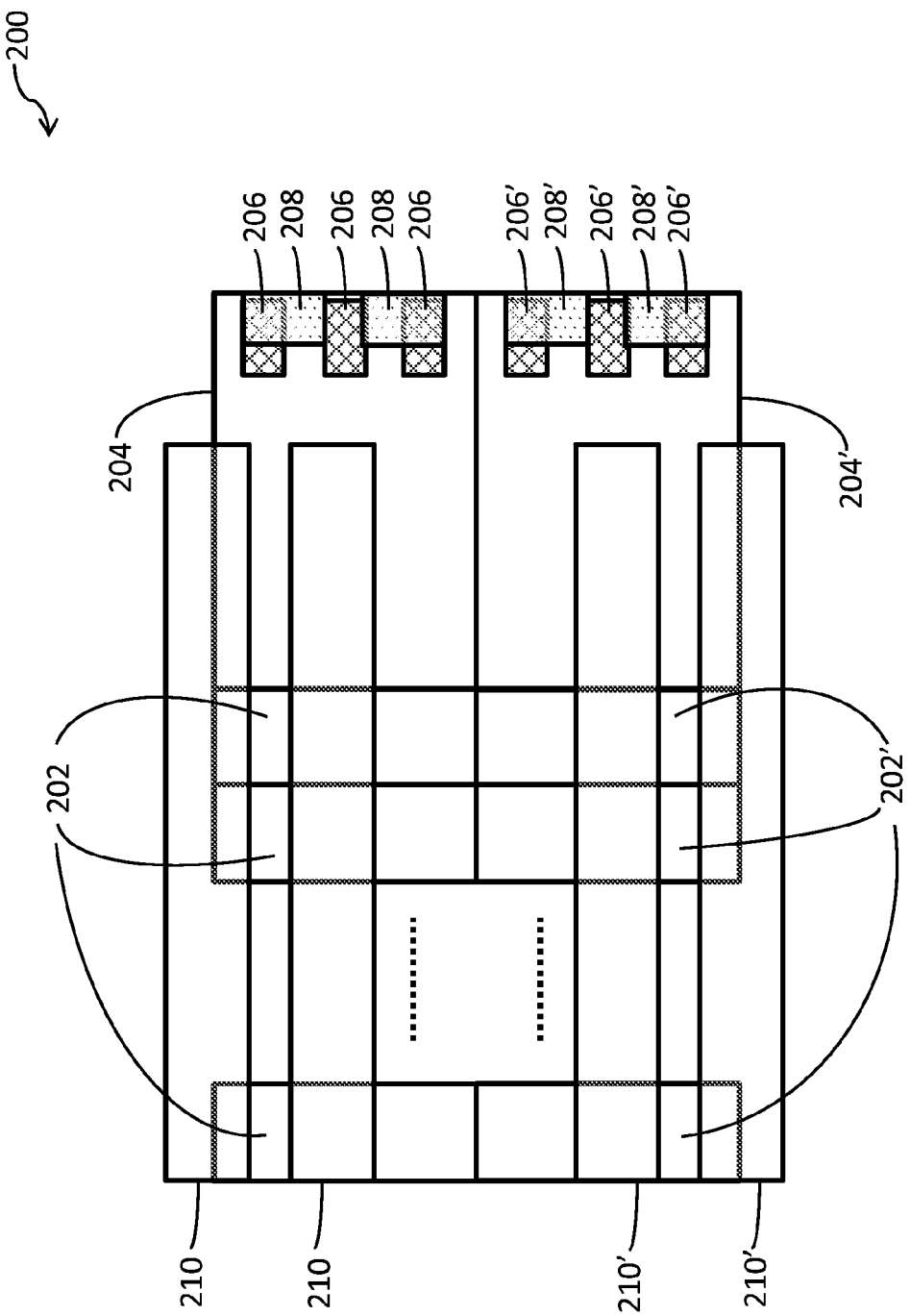
FIG. 2 is a top view of another IC layout of a memory macro sub-block according to an embodiment.

FIG. 2 is a top view of another IC layout of a memory macro sub-block 200. The memory macro sub-block 200 includes a first series of SRAM MUX1 memory cells 202 electrically coupled to an I/O block 204 and a Nth series of SRAM MUX1 memory cells 202' electrically coupled to an Nth I/O block 204'. I/O block 204 is electrically coupled to three 2P2E-compliant I/O pin boxes 206 and two 1P1E-compliant I/O pin boxes 208. Similarly, I/O block 204' is electrically coupled to three 2P2E-compliant I/O pin boxes 206' and two 1P1E-compliant I/O pin boxes 208'. The first series of SRAM MUX1 memory cells 202 and I/O block 204 are electrically coupled to power pins 210. The Nth series of SRAM MUX1 memory cells 202' and I/O block 204' are electrically coupled to power pins 210'. One of the power pins 210 is electrically coupled to VDD and another of the power pins 210 is electrically coupled to VSS. One of the power pins 210' is electrically coupled to VDD and another of the power pins 210' is electrically coupled to VSS. Power pins 210 and power pins 210' are formed in metal 4 routing layer (M4).

The three 2P2E-compliant I/O pin boxes 206 are electrically coupled to metal 1 and metal 2 (M1/M2) routing layers. However, unlike the two 1P1E-compliant I/O pin boxes 108 in FIG. 1., the two 1P1E-compliant I/O pin boxes 208 are electrically coupled to the metal 3 (M3) routing layer, but are not electrically coupled to the metal 4 routing layer (M4). Furthermore, the two 1P1E-compliant I/O pin boxes 208 are configured differently than the 1P1E-compliant I/O pin boxes 108 in FIG. 1. Specifically, the two 1P1E-compliant I/O pin boxes 208 are configured to be taller than wide, as illustrated in FIG. 2. This configuration of the two 1P1E-compliant I/O pin boxes 208 spans more of a rightmost edge of the I/O block 204 as compared to the two 1P1E-compliant I/O pin boxes 108 in FIG. 1, but enables a better electrical/physical connection because of the increased area exposed on the rightmost edge. As illustrated in FIG. 2, one of the plurality of 1P1E pin boxes 208 extends a greater distance along an edge of an I/O block 204 than one of the plurality of 2P2E pin boxes 206. In some embodiments, the 1P1E pin boxes 208 extend a smaller distance along an edge of an I/O block 204 than the 2P2E pin boxes 206. Note that in some embodiments, I/O pin boxes 206 and I/O pin boxes 208 are electrically coupled with other metal layers or with more than one or two metal layers. The three 2P2E I/O pin boxes 206 are formed in either M1 or M2 and the two 1P1E I/O pin boxes 208 are formed in either M3 or M4. In some embodiments the I/O pin boxes 206, 208 are formed in metal at other levels.

The three 2P2E I/O pin boxes 206 are physically placed in row at a lower level than the two 1P1E I/O pin boxes 208 which are on an upper level. Physical separation of the three 2P2E I/O pin boxes 206 on a lower level and the two 1P1E I/O pin boxes 208 on an upper level above the lower level enable additional spacing between the pins so that pitch requirements associated with 1P1E and 2P2E photolithography techniques are both complied with. The smaller pitch requirements associated with the 2P2E I/O pin boxes 206 enable at least three 2P2E I/O pins to be placed on a single lower level at a rightmost edge of the I/O block 204, or different pin box configurations to be employed, while larger pitch requirements associated with the 1P1E I/O pin boxes 208 enable at least two 1P1E I/O pins to be placed on a single upper level at a rightmost edge of the I/O block 204 or different pin box configurations to be employed. In some embodiments, more or less numbers of I/O pins are placed on a level at an edge of the I/O block 204. Placement of the three 2P2E I/O pin boxes 206 and two 1P1E I/O pins at an edge of the I/O block 204 enable five I/O pins to be electrically coupled to the I/O block 204 in compliance with associated pitch requirements and design requirements specifying 5 pins.

Figure 3:
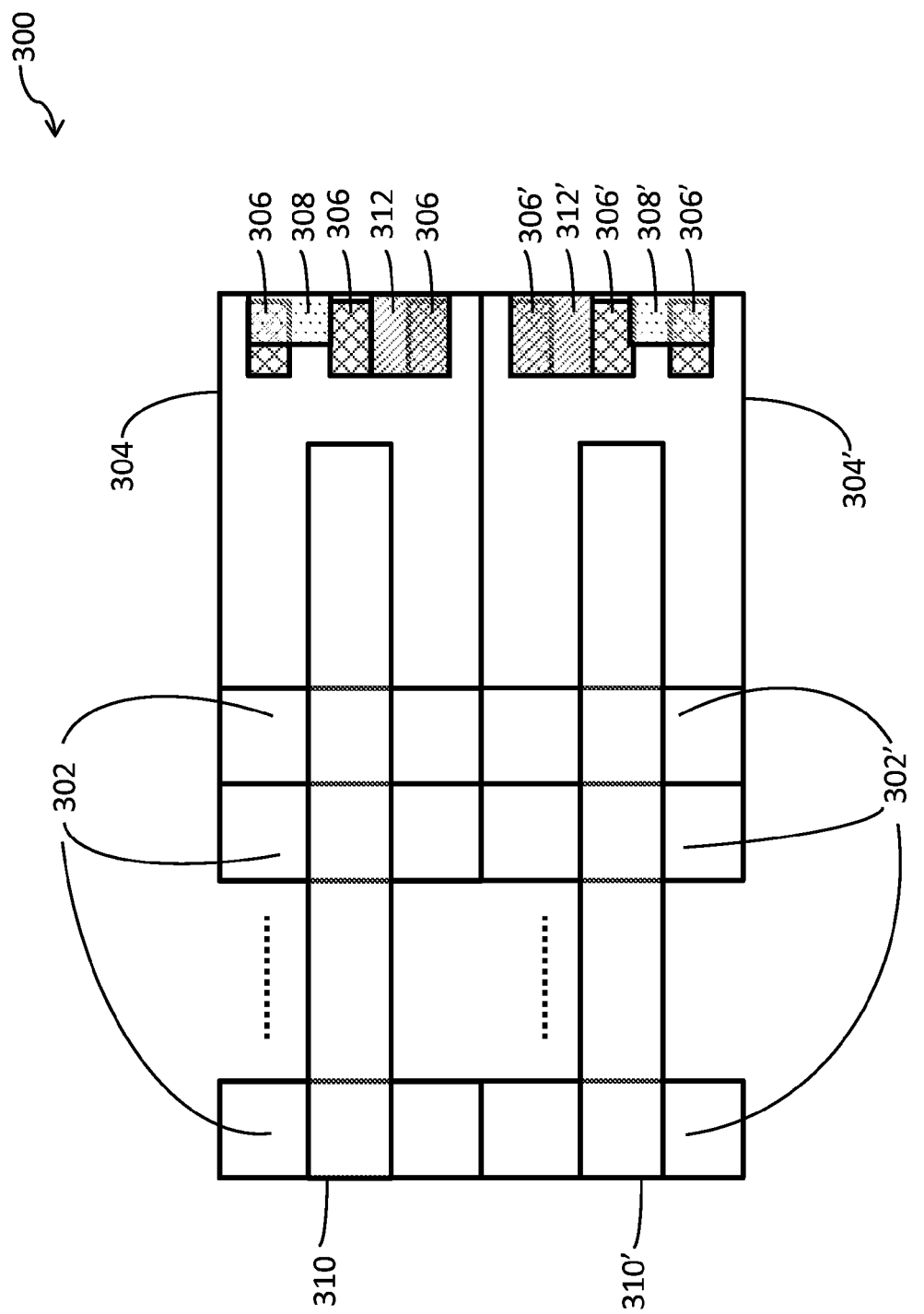
FIG. 3 is a top view IC of yet another layout of a memory macro sub-block according to an embodiment.

FIG. 3 is a top view of yet another IC layout of a memory macro sub-block 300. The memory macro sub-block 300 includes a first series of SRAM MUX1 memory cells 302 electrically coupled to an I/O block 304 and a Nth series of SRAM MUX1 memory cells 302' electrically coupled to an Nth I/O block 304'. I/O block 304 is electrically coupled to three 2P2E-compliant I/O pin boxes 306 and two 1P1E-compliant I/O pin boxes 308. Similarly, I/O block 304' is electrically coupled to three 2P2E-compliant I/O pin boxes 306' and two 1P1E-compliant I/O pin boxes 308'. The first series of SRAM MUX1 memory cells 302 and I/O block 304 are electrically coupled to power pin 310. The Nth series of SRAM MUX1 memory cells 302' and I/O block 304' are electrically coupled to power pin 310'. Power pin 310 is electrically coupled to VDD and power pin 310' is electrically coupled to VSS. Power pin 310 and power pin 310' are formed in metal 4 routing layer (M4).

The three 2P2E-compliant I/O pin boxes 306 are electrically coupled to metal 1 and metal 2 (M1/M2) routing layers. However, unlike the two 1P1E-compliant I/O pin boxes 108 in FIG. 1, the one 1P1E-compliant I/O pin box 308 is electrically coupled to the metal 3 and metal 4 (M3/M4) routing layers, but another 1P1E-compliant I/O pin box 312 is electrically coupled to the metal 3 (M3) routing layer, but not the metal 4 (M4) routing layer. Furthermore, 1P1E-compliant I/O pin box 312 is configured differently than the 1P1E-compliant I/O pin box 308. Specifically, 1P1E-compliant I/O pin box 312 is configured to be twice as wide as I/O pin box 308, as illustrated in FIG. 3. This configuration of the 1P1E-compliant I/O pin box 312 increases the overall size of the pin box as compared to the 1P1E-compliant I/O pin box 308 to enable a better electrical connection because of the increased area of metal present. As illustrated in FIG. 3, one of the plurality of 1P1E-compliant pin boxes 312 extends a greater distance along an edge of an I/O block 304 than one of the plurality of 2P2E-compliant pin boxes 306, and wherein the one of the plurality of 1P1E-compliant pin boxes 312 extends a greater distance perpendicular to an edge of the I/O block than one of the plurality of 1P1E pin boxes 308. The three 2P2E I/O pin boxes 306 are formed in either M1 or M2 and the two 1P1E I/O pin boxes 308, 312 are formed in either M3 or M4. In some embodiments the I/O pin boxes 106, 108 are formed in metal at other levels.

The three 2P2E I/O pin boxes 306 are physically placed in row at a lower level than the two 1P1E I/O pin boxes 308, 312 which are on an upper level. Physical separation of the three 2P2E I/O pin boxes 306 on a lower level and the two 1P1E I/O pin boxes 308 on an upper level above the lower level enable additional spacing between the pins so that pitch requirements associated with 1P1E and 2P2E photolithography techniques are both complied with. The smaller pitch requirements associated with the 2P2E I/O pin boxes 306 enable at least three 2P2E I/O pins to be placed on a single lower level at a rightmost edge of the I/O block 304, or different pin box configurations to be employed, while larger pitch requirements associated with the 1P1E I/O pin boxes 308 enable at least two 1P1E I/O pins to be placed on a single upper level at a rightmost edge of the I/O block 304 and different pin box configurations to be employed. In some embodiments, more or less numbers of I/O pins are placed on a level at an edge of the I/O block 204. Placement of the three 2P2E I/O pin boxes 206 and two 1P1E I/O pins at an edge of the I/O block 204 enable five I/O pins to be electrically coupled to the I/O block 204 in compliance with associated pitch requirements and design requirements specifying 5 pins.

An aspect of this description is related to and integrated circuit (IC) memory device. The IC memory device comprises a first conductive layer. The IC memory device also comprises a second conductive layer over the first conductive layer. The IC memory device further comprises a first-type pin box electrically coupled with the first conductive layer. The IC memory device additionally comprises a second-type pin box, different from the first-type pin box, electrically coupled with the second conductive layer.

Another aspect of this description is related to an integrated circuit (IC) memory device. The IC memory device comprises a first conductive layer on a first level. The IC memory device also comprises a second conductive layer electrically coupled with the first conductive layer. The second conductive layer is on a second level different from the first level. The IC memory device further comprises a third conductive layer separated from the second conductive layer. The third conductive layer is on a third level different from the first level and different from the second level. The IC memory device additionally comprises a fourth conductive layer separated from the third conductive layer. The fourth conductive layer is on a fourth level different from the first level, different from the second level, and different from the third level. The IC memory device also comprises a first-type pin box electrically coupled with the first conductive layer and the second conductive layer. The IC memory device further comprises a second-type pin box electrically coupled with one of the third conductive layer or the fourth conductive layer.

A further aspect of this description is related to an integrated circuit (IC) memory device. The IC memory device comprises a first conductive layer. The IC memory device also comprises a second conductive layer electrically coupled with the first conductive layer, the second conductive layer being over the first conductive layer. The IC memory device further comprises a third conductive layer separated from the second conductive layer, the third conductive layer being over the second conductive layer. The IC memory device additionally comprises a fourth conductive layer electrically coupled with the third conductive layer, the fourth conductive layer being over the third conductive layer. The IC memory device also comprises a double exposure and double etch (2P2E) pin box electrically coupled with one or more of the first conductive layer or the second conductive layer. The IC memory device further comprises a single exposure and single etch (1P1E) pin box electrically coupled with one or more of the third conductive layer or the fourth conductive layer.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. An integrated circuit (IC) memory device, comprising:
   a first conductive layer;
   a second conductive layer over the first conductive layer;
   a first-type pin box electrically coupled with the first conductive layer, wherein the first-type pin box has a first pitch requirement; and
   a second-type pin box electrically coupled with the second conductive layer, wherein the second-type pin box has a second pitch requirement different from the first pitch requirement.

2. The IC memory device of claim 1, wherein the first-type pin box is electrically coupled to a metal layer between first conductive layer and the second conductive layer.

3. The IC memory device of claim 1, wherein the second-type pin box is electrically coupled to a metal layer above the second conductive layer.

4. The IC memory device of claim 1, wherein the first-type pin box is electrically coupled to an input/output (I/O) pin.

5. The IC memory device of claim 1, wherein the second-type pin box is electrically coupled to an input/output (I/O) pin.

6. The IC memory device of claim 1, wherein the first-type pin box is electrically coupled to a first memory cell and the second-type pin box is electrically coupled to a second memory cell.

7. The IC memory device of claim 6, wherein the memory device is a static random access memory (SRAM).

8. The IC memory device of claim 6, wherein the memory device includes a static random access memory (SRAM) multiplexer one (MUX1) memory cell.

9. An integrated circuit (IC) memory device, comprising:
a first conductive layer on a first level;
a second conductive layer electrically coupled with the first conductive layer, wherein the second conductive layer is on a second level different from the first level;
a third conductive layer separated from the second conductive layer, wherein the third conductive layer is on a third level different from the first level and different from the second level;
a fourth conductive layer separated from the third conductive layer, wherein the fourth conductive layer is on a fourth level different from the first level, different from the second level, and different from the third level;
a first-type pin box electrically coupled with the first conductive layer and the second conductive layer, wherein the first-type pin box has a first pitch requirement; and
a second-type pin box electrically coupled with one of the third conductive layer or the fourth conductive layer, wherein the second-type pin box has a second pitch requirement different from the first pitch requirement.

10. The IC memory device of claim 9, wherein the first conductive layer is a first metal layer and the second conductive layer is a second metal layer electrically coupled to the first metal layer by at least one metal via.

11. The IC memory device of claim 9, wherein the third conductive layer is a third metal layer and the fourth conductive layer is a fourth metal layer electrically coupled to the third metal layer by at least one metal via.

12. The IC memory device of claim 9, wherein the first-type pin box is electrically coupled to an I/O pin.

13. The IC memory device of claim 9, wherein the second-type pin box is electrically coupled to an I/O pin.

14. The IC memory device of claim 9, wherein the first-type pin box is electrically coupled to a first memory cell and the second-type pin box is electrically coupled to a second memory cell.

15. The IC memory device of claim 14, wherein the memory device is a static random access memory (SRAM).

16. The IC memory device of claim 14, wherein the memory device includes a static random access memory (SRAM) multiplexer one (MUX1) memory cell.

17. An integrated circuit (IC) memory device, comprising:
a first conductive layer;
a second conductive layer electrically coupled with the first conductive layer, the second conductive layer being over the first conductive layer;
a third conductive layer separated from the second conductive layer, the third conductive layer being over the second conductive layer;
a fourth conductive layer electrically coupled with the third conductive layer, the fourth conductive layer being over the third conductive layer;
a double exposure and double etch (2P2E) pin box electrically coupled with one or more of the first conductive layer or the second conductive layer; and
a single exposure and single etch (1P1E) pin box electrically coupled with one or more of the third conductive layer or the fourth conductive layer.

18. The IC memory device of claim 17, wherein
the first conductive layer is a first metal layer,
the second conductive layer is a second metal layer electrically coupled to the first metal layer by at least one metal via,
the third conductive layer is a third metal layer, and
the fourth conductive layer is a fourth metal layer electrically coupled to the third metal layer by at least one metal via.

19. The IC memory device of claim 17, wherein the 2P2E pin box is electrically coupled to a first memory cell and the 1P1E pin box is electrically coupled to a second memory cell.

20. The IC memory device of claim 19, wherein the memory device is a static random access memory (SRAM).

* * * * *